United States Patent [19]

Smith

[11] Patent Number: 4,495,485
[45] Date of Patent: Jan. 22, 1985

[54] TOUCH CONTROL ARRANGEMENT FOR DATA ENTRY

[75] Inventor: Peter H. Smith, Anchorage, Ky.

[73] Assignee: General Electric Company, Louisville, Ky.

[21] Appl. No.: 528,075

[22] Filed: Aug. 31, 1983

Related U.S. Application Data

[63] Continuation of Ser. No. 215,998, Dec. 12, 1980, abandoned.

[51] Int. Cl.³ .................................................. G08C 9/00
[52] U.S. Cl. ........................... 340/365 C; 340/365 S; 200/DIG. 1; 178/17 C; 179/90 K; 219/10.55 E; 331/49; 331/64
[58] Field of Search ........... 340/365 C, 365 R, 365 E, 340/711; 200/DIG. 1, 52 R; 178/17 C; 179/90 K; 331/48, 65, 54, 55, 49; 219/10.55 E, 10.55 R

[56] References Cited

U.S. PATENT DOCUMENTS

| | | | |
|---|---|---|---|
| 2,365,566 | 12/1944 | Langer | 84/1.22 |
| 2,497,661 | 2/1950 | Dome | 84/1.01 |
| 2,701,279 | 2/1955 | Lovell et al. | 179/90 |
| 3,115,803 | 12/1963 | Pedicano | 84/470 |
| 3,140,358 | 7/1964 | Martens | 179/90 |
| 3,676,607 | 7/1972 | Nash et al. | 179/90 K |
| 3,691,555 | 9/1972 | Looschen | 340/365 |
| 3,983,553 | 9/1976 | Kesling | 340/365 |
| 3,988,701 | 10/1976 | Funston | 331/179 |
| 4,103,252 | 7/1978 | Bobick | 331/48 |
| 4,266,118 | 5/1981 | Takase et al. | 219/492 |

Primary Examiner—Donnie L. Crosland
Attorney, Agent, or Firm—H. Neil Houser; Radford M. Reams

[57] ABSTRACT

A touch control arrangement which employs a touch panel comprising a plurality of touch keys and a network of electrically connected capacitive elements; an oscillator which incorporates the network of capacitive elements in its timing circuit; and a microprocessor coupled to the output of the oscillator and operative to control various appliance operating components as determined by the frequency of the oscillator output signal. The keys of the touch panel are operatively coupled to the network of capacitive elements such that actuation of a key or pad by the user changes the equivalent capacitance of the timing circuit causing the oscillator a generate a control signal at the frequency associated with the actuated key.

7 Claims, 11 Drawing Figures

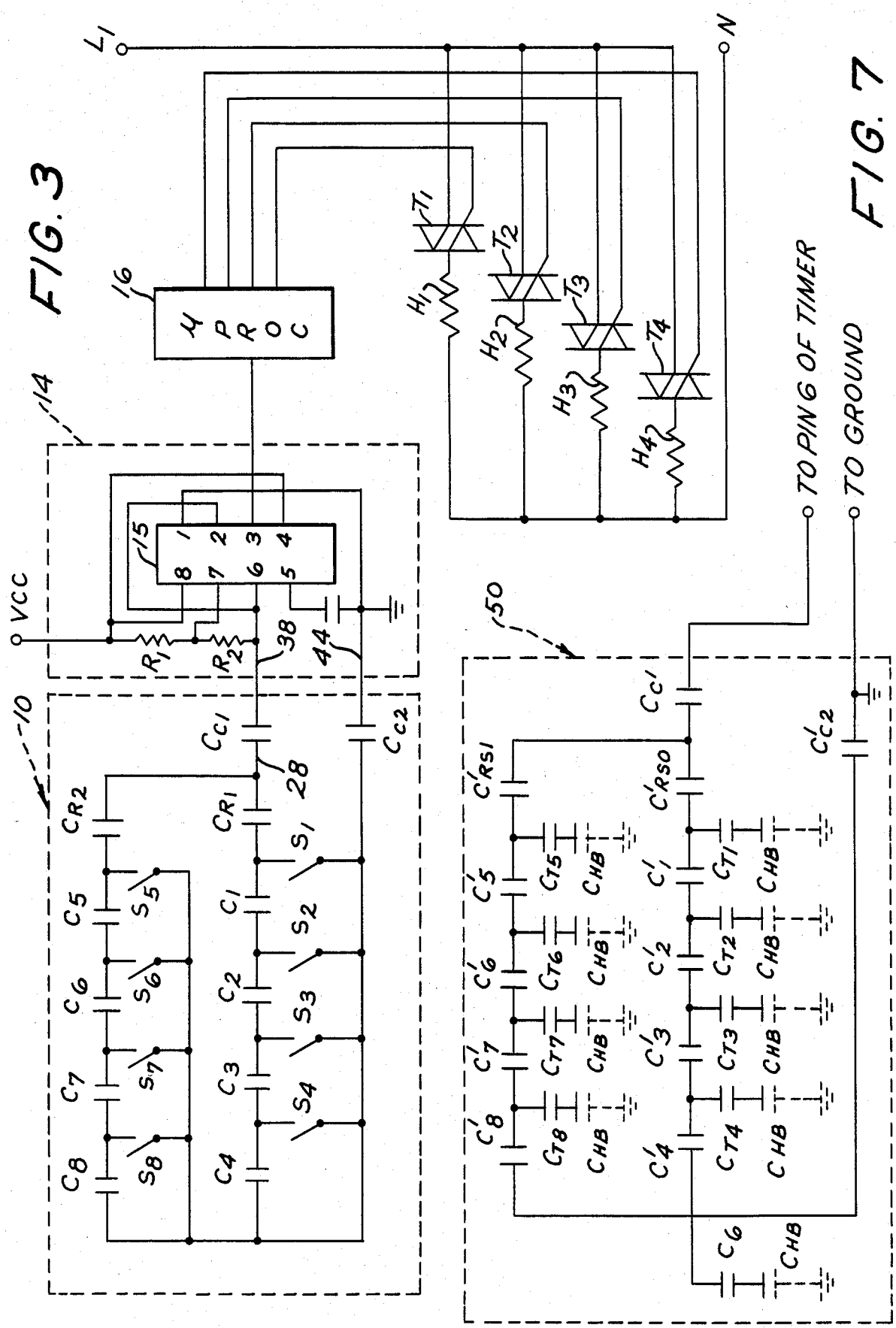

TOUCH CONTROL ARRANGEMENT FOR DATA ENTRY

This application is a continuation, of application Ser. No. 215,998, filed Dec. 12, 1980 now abandoned.

BACKGROUND OF THE INVENTION

The present invention relates generally to touch control arrangements for apparatus incorporating a plurality of operating components arranged for selective actuation in accordance with user generated input data. More specifically, this invention relates to touch control arrangements incorporating tactile or capacitive touch keyboard panels for use with domestic appliances such as ranges and microwave ovens.

Touch control arrangements are commonly used for user data entry for appliance controls. Such arrangements typically include touch panels of the tactile or membrane switch type or of the capacitive touch type. In the tactile or membrane switch touch panel, each key of the input keyboard is actuated by pressure applied to the key by the user which closes electrical contacts. In the capacitive touch panel, the keyboard is an array of touch pads, each forming a plate of a sensor capacitor and the keys are actuated by the touch of a human finger. When a pad is touched, the body capacitance of the user changes the effective capacitance associated with the touch pad. This change in capacitance attenuates the control signal from the touch panel, thereby indicating to the electronic control device which pad has been actuated.

Generally, both the tactile touch and the capacitive touch panels employ keyboard arrays in which the keys or pads are arranged in row and column matrices. The keyboard array has a separate input line associated with each column and a separate output line associated with each row of keys or touch pads. The electronic controller, typically a microprocessor, monitors the keyboard array for inputs by periodically applying a control or strobe pulse sequentially to each of the column input lines and monitors each of the row associated output lines. Thus, in effect, each individual switch key or touch pad is periodically polled by the microprocessor which identifies the actuated key by sensing a change in the magnitude of the strobe signal.

While this matrix type array performs satisfactorily, it has several drawbacks including: the number of input and output lines needed to couple the touch panel to the controller and the associated connections for these lines adds significantly to the expense of the keyboard array; the length of the connecting lines must be limited to minimize the capacitive effects between the lines; the control signal applied to the keyboard comprises a relatively high frequency pulse train presenting electromagnetic interference problems; and the interfacing with the microprocessor ties up several microprocessor input and output ports which could be advantageously employed for other purposes.

It is therefore an object of the present invention to provide a touch control arrangement which overcomes the above mentioned drawbacks of prior art arrangements by employing oscillating means responsive to the user actuable touch keys, which operates to generate a control signal at a plurality of frequencies, the frequency being determined by the selective touching of the touch keys by the user, and an electronic controller which responds to the frequency of the control signal.

It is a further object of the present invention to provide a touch control arrangement of the aforementioned type which employs only two lines for interfacing with the electronic controller, thereby permitting relatively long connections, freeing up a number of controller input and output ports and significantly reducing the cost of the touch control arrangement.

It is a further object of the present invention to provide a touch control arrangement of the aforementioned type which employs a relatively low frequency sinusoidal signal, thereby eliminating electromagnetic interference problems.

It is a further object of the present invention to provide a control arrangement of the aforementioned type which is applicable to both tactile touch and capacitive touch type keyboard structures.

SUMMARY OF THE INVENTION

The touch control arrangement of the present invention employs a touch panel comprising a plurality of touch keys and a network of electrically connected capacitive elements; an oscillator which incorporates the network of capacitive elements in its timing circuit; an electronic controller coupled to the output of the oscillator and operative to control various appliance operating components as determined by the frequency of the oscillator output signal. The keys of the touch panel are operatively coupled to the network of capacitive elements such that actuation of a key or pad by the user changes the equivalent capacitance of the timing circuit causing the oscillator to generate a control signal at the frequency associated with the actuated key.

In accordance with one aspect of the present invention, the touch control arrangement comprises a tactile touch keyboard arrangement in which the user actuates a key by depressing the key, thereby changing the equivalent capacitance of the network to a value corresponding to the actuated key by shunting a predetermined portion of the capacitive network. In accordance with another aspect of the present invention, the keyboard arrangement comprises a capacitive touch keyboard array in which body capacitance of the user when touching a key changes the equivalent capacitance of the network to the value associated with the pad that is touched.

BRIEF DESCRIPTION OF THE DRAWINGS

While the novel features of the invention are set forth with particularity in the appended claims, the invention both as to organization and content will be better understood and appreciated from the following detailed description taken in conjunction with the drawings in which:

FIG. 3 is a schematic diagram of the tactile touch embodiment of the control arrangement of the present invention;

FIG. 7 is a partial schematic diagram of the capacitive touch type embodiment of the touch control arrangement of the present invention;

DETAILED DESCRIPTION OF THE INVENTION

Figure 1:
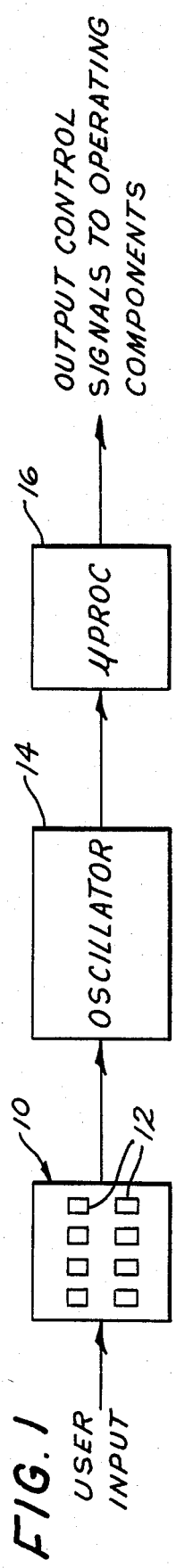
FIG. 1 is a simplified block diagram of the touch control arrangement of the present invention.

The present invention comprises a touch control arrangement for apparatus of the type incorporating a plurality of operating components arranged for selective actuation in accordance with user generated input data. Referring first to FIG. 1, the touch control arrangement includes touch responsive data entry means in the form of a touch panel 10, having a plurality of touch keys 12 arranged for user actuation, oscillating means 14 for generating a control signal at a plurality of predetermined frequencies, and an electronic controller 16 responsive to the control signal from oscillator 14 and adapted to selectively actuate the operating components of the apparatus in a manner determined by the frequency of the control signal. In this arrangement, oscillating means 14 is operatively coupled to data entry means 10 such that the frequency of the control signal is determined by the selective actuation of touch keys 12 by the user.

The touch keys of the touch panel are operatively coupled to a capacitive network. This capacitive network is electrically coupled in tuning relationship with the oscillating means such that the frequency of the oscillator output signal is a function of the equivalent or effective capacitance of the capacitive network. Each touch key is operative when actuated to change the equivalent or effective capacitance of the network to a unique predetermined value. Consequently, each key has uniquely associated with it a predetermined control signal frequency. The oscillator output signal is the input signal to the electronic controller which is programmed to control appliance operation in accordance with the frequency of the control signal from the oscillator.

Figure 2:
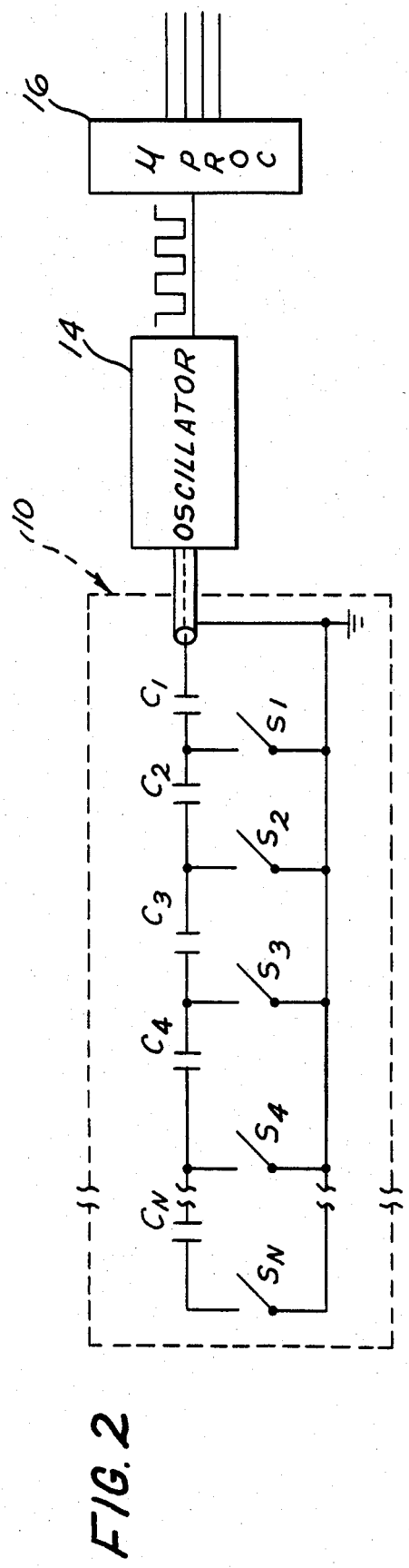
FIG. 2 is a simplified schematic circuit diagram for the touch control arrangement of the present invention.

The basic operation of applicant's invention may be most easily understood by reference to the simplified schematic circuit diagram of FIG. 2. In this illustration, the capacitive network of touch panel 10 comprises a plurality of serially connected capacitors $C_1$–$C_N$. Each of the plurality of switches $S_1$–$S_N$ is uniquely associated with a corresponding touch key 12 on touch panel 10. Conceptually, the normally open switches may be thought of as being closed by user actuation of the corresponding touch key.

The effective or equivalent capacitance $C_{eq}$ of a string of N serially connected capacitors is given by the expression $$\frac{1}{C_{eq}} = \sum_{i=1}^{N} \frac{1}{C_i}.$$

In the capacitance network of FIG. 2, when no key is actuated all N capacitors are operative. However, the closing of any one of the switches changes the equivalent capacitance of the network by shunting a portion of the capacitive network from the circuit so that the effective number of operative capacitors is less than N. For example, if switch $S_1$ is closed, capacitors $C_2$–$C_N$ are shunted and $1/C_{eq}=1/C_1$. Similarly, if switch $S_3$ is closed, capacitors $C_4$–$C_N$ are shunted and $1/C_{eq}+1/C_1+1/C_2+1/C_3$.

It is apparent from the expression for $C_{eq}$ that a different predetermined value of $C_{eq}$ results from the closing of each switch and is thus uniquely associated with each switch.

The tuning relationship of the capacitive network to the oscillator results from the connection of the capacitive network in the RC timing circuit of oscillator 14 so that the frequency of the oscillator output control signal is determined by the value of the equivalent capacitance of the capacitive network. Consequently, the oscillator control signal is tuned to one of a plurality of predetermined frequencies according to which key is actuated by the user. The appliance controller then responds to the frequency of the oscillator output signal.

In each of the illustrative embodiments herein described the appliance controller is a microprocessor adapted to count the pulses of the oscillator control signal to determine which key is actuated and to respond accordingly by generating appropriate control signals for the various appliance operating components. However, it is to be understood that the oscillator control signal may be processed in other ways either by the microprocessor or by signal processing circuitry interfaced between the oscillator and the microprocessor without departing from this invention provided only that the information from the touch panel is carried initially by the frequency of the panel output signal.

The illustrative embodiment to be next described employs a touch control arrangement in accordance with the present invention in the control of a four-element cooktop (not shown). It is to be understood, however, that the touch control arrangement may be readily adapted for the control of a variety of home appliances such as microwave ovens and ranges, as well as applications in industrial and other environments.

In the description to follow, the term "key" or touch key is used generically to refer to the data entry key for touch panels employing flexible membrane switch contactors and to the touch pads of capacitive touch type touch panels. The touch control arrangements described herein employ an eight-key touch panel. It is to be understood that this is merely illustrative and that a greater or lesser number of keys may be employed depending upon the nature of the user generated input data required for control purposes.

FIG. 3 presents a simplified circuit diagram for an eight-key tactile touch type touch control arrangement. Touch panel 10 of FIG. 1 is represented schematically in FIG. 3 as a capacitive network comprising two parallel connected strings of serially connected capacitive elements; one string comprising elements $C_{R1}$ and $C_1$–$C_4$, and the other comprising $C_{R2}$ and $C_5$–$C_8$, and switches $S_1$–$S_8$ arranged to selectively shunt portions of the capacitive network. Touch panel switches $S_1$–$S_8$ are closed by pressure applied to the corresponding touch keys on the touch panel by the user. A preferred structural arrangement for touch panel 10 will be described further on with reference to FIGS. 4–6.

The oscillating means 14 in FIG. 3 incorporates a monolithic timing circuit 15, suffix-555, which is readily commercially available from a variety of manufacturers (SN 72555, LM 555, etc.). In the illustrative embodiment, timer 15 is operated as an astable RC multivibrator with resistors $R_1$ and $R_2$ and the capacitive network of touch panel 10 providing the RC timing network. The pin connections shown in FIG. 3 are standard for operating the timer in the astable mode. When operated in this mode, the frequency, f, of the output signal which appears at pin 3 is determined by the following relationship:

$$f = \frac{1.44}{(R_1 + 2R_2)C_{eq}} \cdot C_{eq}$$

in this expression represents the equivalent or effective capacitance of the capacitive network of touch panel 10. The capacitive network is capacitively coupled to timer 15 through coupling capacitors $C_{C1}$ and $C_{C2}$, in order to facilitate interconnecting the touch panel circuit board to external circuitry. However, it is understood that the capacitive network could be connected to the timer through a direct conductive path. The capacitance of elements $C_{C1}$ and $C_{C2}$ is chosen to be substantially greater than the capacitance of $C_{R1}$, $C_{R2}$, and $C_1$-$C_8$ so that they do not significantly affect the value of the effective capacitance of the capacitive network for timing purposes. Bypass capacitor $C_B$ capacitively couples the modulation input, pin 5 of timer 15, to ground to prevent pickup of stray signals.

For reasons to follow, the use of parallel strings of serially connected elements in FIG. 3 is believed to provide certain advantages over a single string arrangement of FIG. 2. It is to be understood, however, that a capacitive network of eight serially connected capacitive elements could readily be employed in the arrangement of FIG. 3 in place of the network shown. As is apparent from the expressions for $C_{eq}$ and f hereinbefore described, as the number of capacitors in a string is increased to accommodate more keys, the equivalent capacitance of the network decreases in decreasing increments. As a result, the frequency range of the oscillator output signal increases as the number of capacitive elements in the string increases, but the gap between the frequencies associated with each key decreases as the frequency increases. Both of these factors tend to increase the frequency discrimination burden for the microprocessor as the number of keys is increased. It has been determined that the number of capacitive elements and associated key pads can be increased at least four-fold relative to that of a single serial string while maintaining essentially the frequency range associated with the single string by connecting up to three additional strings of serially connected capacitors in parallel with the initial string.

In the circuit of FIG. 3, the capacitive network essentially comprises two parallel connected strings of capacitive elements. By appropriate selection of capacitance values for range determining capacitors $C_{R1}$ and $C_{R2}$, the frequencies associated with one string can be interleaved with the frequencies associated with the other. By selecting $C_{R1}$ and $C_1$-$C_8$ to be of equal capacitance and $C_{R2}$ to be one half of $C_{R1}$, the frequency associated with the actuation of switch $S_5$ falls between that for $S_1$ and $S_2$; that for $S_6$ falls between $S_2$ and $S_3$; that for $S_7$ falls between $S_3$ and $S_4$; and that for $S_8$ is just beyond that for $S_4$, so that the frequency range for the eight-key touch panel is just slightly greater than that for a four-key panel using only serially connected capacitive elements.

In the illustrative embodiment of FIG. 3, each of elements $C_1$-$C_8$ are designed for a nominal capacitance of 50 pF. With no switch actuated, the equivalent capacitance of the capacitive network is calculated to be approximately 18.5 pF. The maximum value for the equivalent capacitance occurs with switch $S_1$ closed effectively shunting capacitance elements $C_1$-$C_4$ leaving capacitance $C_{R1}$ in parallel with the series combination of $C_{R2}$ and $C_5$-$C_8$. The equivalent capacitance with $S_1$ closed is calculated to be approximately 58.4 pF. For $R_1$ and $R_2$ at 500K ohms and 250K ohms, respectively, the frequency of the oscillator output signal ranges from approximately 78 KHz corresponding to all open switches to approximately 25 KHz corresponding to switch $S_1$ being closed.

In the illustrative embodiment of FIG. 3, electronic controller 16 is a microprocessor programmed to control the energization of the four resistive heating elements $H_1$-$H_4$ in a cooktop. The touch panel is arranged such that touch key actuated switches $S_1$-$S_4$ are associated with heating elements $H_1$-$H_4$, respectively, and key switches $S_5$-$S_8$ identify the high, medium and low power settings and the OFF setting, respectively, for operating the heating elements. The user provides the necessary control information by first actuating one of switches $S_1$-$S_4$ to select the heating elements and then actuating one of switches $S_4$-$S_8$ to select the power setting. The microprocessor is programmed to identify which switch is actuated by the user by counting the pulses of the control signal from pin 3 of timer 15. After determining the heating element selected and the power setting selected for that heating element, the microprocessor then generates a triggering signal to that one of triacs $T_1$-$T_4$ in series with the designated heating element, causing the triac to be triggered on in a manner which provides the desired power corresponding to the power setting selected for that heating element. For example, the low power setting may correspond to 25 percent of full power in which case the triac could be triggered into its conducting mode every fourth half cycle of the power signal. Medium power may correspond to 50 percent, in which case the triac would be triggered on every other half cycle and for 75 percent per power the triac may be turned on for three half cycles every four half cycles, and for full power the triac is in its conductive mode continuously. Alternatively, the power signal may be chopped by permitting the triacs to be triggered into conduction only for predetermined portions of each half-cycle to provide the desired power level.

It is to be understood that this cooktop control application is merely a simplified conceptual description of one application of the touch control arrangement of the present invention. The manner in which the microprocessor is programmed to control the heating elements does not form a part of the present invention. The schematic of this portion of the circuit is greatly simplified and merely intended to demonstrate conceptually one way of using a touch panel in accordance with the present invention. Details on the programming of the microprocessor and the circuitry employed in actual cooktop control arrangement have been omitted for the purposes of simplicity and brevity.

Figure 4:
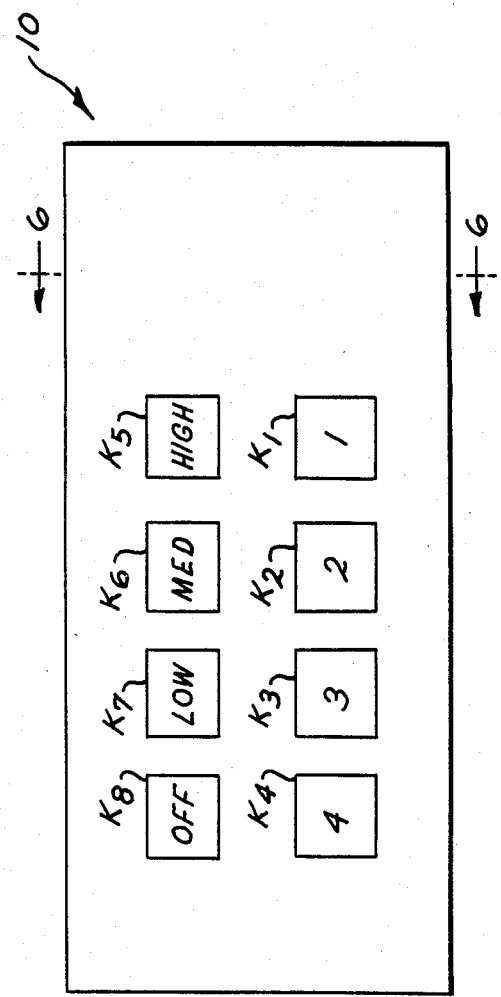
FIG. 4 is a front elevational view illustrating a touch panel illustrative of the touch control arrangement of the present invention.
Figures 5, 6:
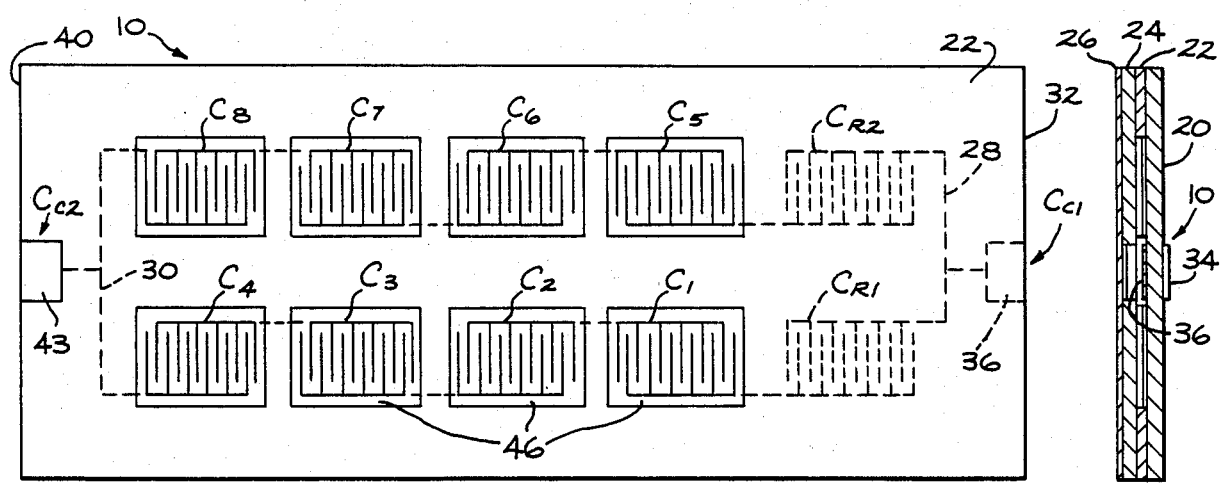
FIG. 5 is an elevational view of the circuit board for the tactile switch embodiment of the present invention.
FIG. 6 is a sectional view taken along lines 6—6 of FIG. 4.

Referring now to FIGS. 4-6, a preferred structure for a tactile touch type touch panel 10 for use in the circuit arrangement of FIG. 3 will be described. FIG. 4 shows the fully assembled touch panel 10 with indicia $K_1$-$K_8$ defining the key locations for the user. Keys $K_1$-$K_8$ are associated with switches $S_1$-$S_8$ respectively (FIG. 3). As best seen in FIG. 6, the touch panel is comprised of several layers. The thickness of the various member layers are exaggerated for clarity. Essentially, touch panel 10 comprises a dielectric substrate 20, an insulating separator 22, a conductive membrane 24 and a polyester overlay 26 imprinted to define the various touch key locations $K_1$-$K_8$.

FIG. 5 shows touch panel 10 with the polyester overlay 26 and conductive membrane 24 removed to show the touch panel circuitry. Dielectric substrate 20 is a circuit board having formed thereon, by copper etching, conductive inking, or other suitable means, conductors configured to form a network of interdigitized capacitive elements $C_{R1}$, $C_{R2}$ and $C_1$-$C_8$. The capacitive elements of the network are arranged in two strings. The first string comprising capacitive elements $C_{R1}$, and $C_1$-$C_4$ is electrically connected in parallel with the second string comprising capacitive elements $C_{R2}$ and $C_5$-$C_8$. Within each string the interdigitized elements are connected in electrical series. An input coupling capacitor $C_{C1}$ is formed on edge 32 of the circuit board. Capacitor $C_{C1}$ comprises a pair of conductive plates 34 and 36 disposed on opposite faces of circuit board 20 with the circuit board itself serving as the dielectric. Plate 34 formed on the rearwardly exposed face of the circuit board provides a contact point for the input conductor 38 (FIG. 3). The oppositely disposed plate 36 is connected to conductor 28. The capacitive network is capacitively coupled to ground through coupling capacitor $C_{C2}$ formed similarly to $C_{C1}$ on the opposite edge 40 of circuit board 20. The rearward plate 42 of capacitor $C_{C2}$ provides the connection for grounding conductor 44 (FIG. 3).

Insulative separator 22 overlays the circuit board, completely covering plate 36 of capacitor $C_{C1}$, capacitive elements $C_{R1}$ and $C_{R2}$, and all of the interconnecting conductive paths. Portions of separator 22 are cut away forming openings 46 exposing capacitive elements $C_1$-$C_8$. The plate 43 of capacitor $C_{22}$ is also exposed.

Resilient conductive membrane 24 overlays insulative separator 22. Conductive membrane 24 is sealed to the insulated separator 22 by an adhesive bonding material and is in electrical contact with plate 43 of capacitor $C_{C2}$ whereby the conductive membrane is capacitively coupled to ground through capacitor $C_{C2}$. Conductive membrane 24 is separated from the exposed capacitive elements by the thickness of insulative separator 22. However, the openings 46 in the insulated separator permit contact between conductive membrane 24 and the capacitive elements when sufficient pressure is applied by the user to the conductive membrane over one of the openings 46. When the conductive membrane 24 is placed in contact with one of the capacitive elements, membrane 24 effectively shunts that capacitor and provides a path through the membrane to ground via coupling capacitor $C_{C2}$. Referring again briefly to FIG. 3, placement of the conductive membrane in contact with an interdigitized capacitive element is represented functionally in FIG. 3 by the closing of the corresponding one of switches $S_1$-$S_8$. For example, user actuation of touch key $K_1$ is analogous to closing switch $S_1$ in the circuit of FIG. 3. Thus, by applying pressure on the appropriate locators, the user effectively shorts the corresponding capacitive element and shunts the remaining elements in its string out of the capacitive network.

Overlay 26 made of a resilient, flexible, insulating material, such as that sold under the trade name Mylar, is placed over the conductive membrane. The graphically imprinted indicia $K_1$-$K_2$ as shown in FIG. 4 directly overlay capacitive elements $C_1$-$C_8$, respectively, to define touch key locations for the user.

The illustrative embodiment of FIGS. 3-6 exemplifies a tactile touch type touch panel in which the user must apply pressure to the touch pad to actuate the touch pad. According to another aspect of the present invention a capacitive touch type of touch panel may be employed in the touch control arrangement in place of the tactile touch type touch panel. With such a touch panel the body capacitance of the user upon touching the touch pad changes the equivalent capacitance of the capacitive network.

Referring now to FIG. 7, a schematic of circuit diagram for an illustrative capacitive touch panel 50 to be used in place of touch panel 10 in the control circuit of FIG. 3 shows a serial string of capacitors $C_{R1}'$ and $C_1'$-$C_4'$ connected in parallel with a serial string of capacitors comprising and $C_{R2}'$ and $C_5'$-$C_8'$.

Capacitors $C_{T1}$-$C_{T8}$ represent touch capacitor elements. One plate of each of these elements comprises a touch pad or key arranged on the touch panel (FIG. 10) for touching by the user. Capacitors $C_{HB}$ shown partially in phantom represent the human body capacitance which is added to the circuit at the touched capacitor when a touch key is touched by the user. $C_G$ is a shield capacitor described further on with reference to FIG. 10. The purpose of $C_G$ is to prevent touching of the panel around the keys from affecting circuit operation. Here, $C_{HB}$ represents body capacitance which is added to the circuit if the user touches the touch panel in an area other than a touch key. Touching of the shield by the user provides a path to ground through $C_G$ and $C_{HB}$ in parallel with coupling capacitor $C_{C2}'$. The capacitance in this parallel path is substantially less than the capacitance of coupling capacitor $C_{C2}'$, and, consequently, has no effect on the equivalent capacitance seen by the timer and consequently does not significantly affect the frequency of the control signal.

$C_{C1}'$ and $C_{C2}'$ are provided to capacitively couple the capacitive network to the timer circuit of FIG. 3. The capacitance of the coupling capacitors $C_{C1}'$ and $C_{C2}'$ is substantially greater than the capacitance of the touch pad capacitors. These capacitors are to facilitate the electrical connection of the touch panel to the external circuitry and could be replaced by direct electrical connections.

As shown in the schematic circuit diagram, when the user touches a particular touch pad a parallel path to ground through the associated touch pad capacitor and the added body capacitance $C_{HB}$ increases the equivalent capacitance of the string and thus the equivalent capacitance of the capacitive network as seen by the timer 15 (FIG. 3). In the illustrative embodiment, the capacitance of capacitive elements $C_1'$ and $C_1'$-$C_8$ is nominally 50 pF; $C_{R2}'$ is nominally 25 PF; capacitive elements $C_{T1}$-$C_{T8}$ are nominally 100 pF and human body capacitance is on the order of 200 pF. Using these parameters, the equivalent capacitance of the capacitive network is calculated to range from a minumum of roughly 18 pF when no pads are touched to a maximum of roughly 39 pF when touch capacitor $C_{T1}$ is touched. The circuitry of FIG. 7 is coupled to the timer in the same manner as in the schematic circuit diagram of FIG. 3. Thus, the frequency of the output signal from the timer, as determined by the same expression as that for FIG. 3, correspondingly varies from a maximum frequency on the order of 79 KHz for the untouched capacitor condition to a minimum of roughly 37 KHz when touch capacitor $C_{T1}$ is touched.

Figures 8, 9:
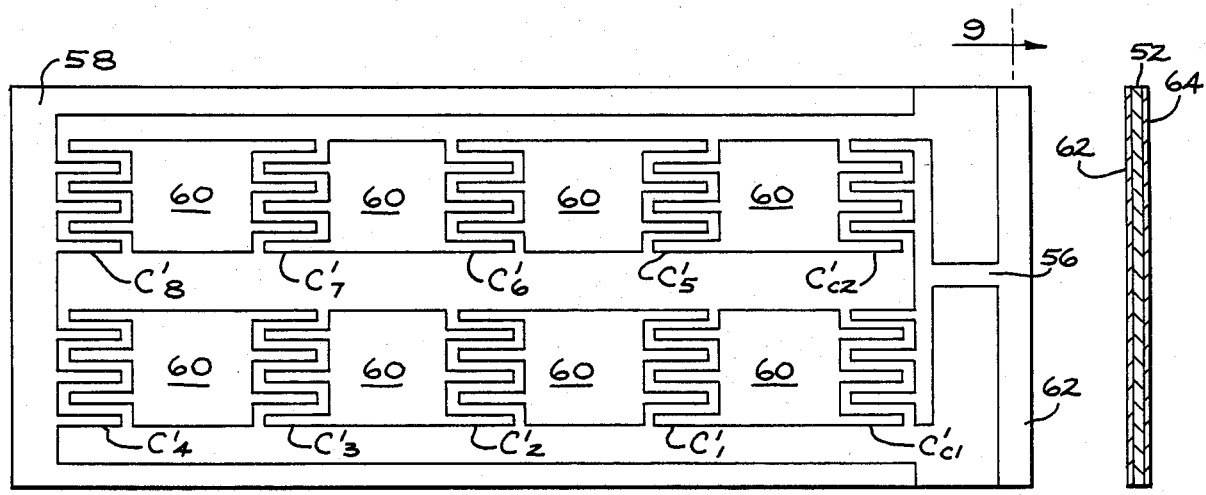
FIG. 8 is a front elevational view of the printed circuit board of the touch control panel employed in the capacitive touch embodiment of the present invention.
FIG. 9 is a cross sectional view of the circuit board of FIG. 10 8 taken along lines 9—9.
Figures 10, 11:
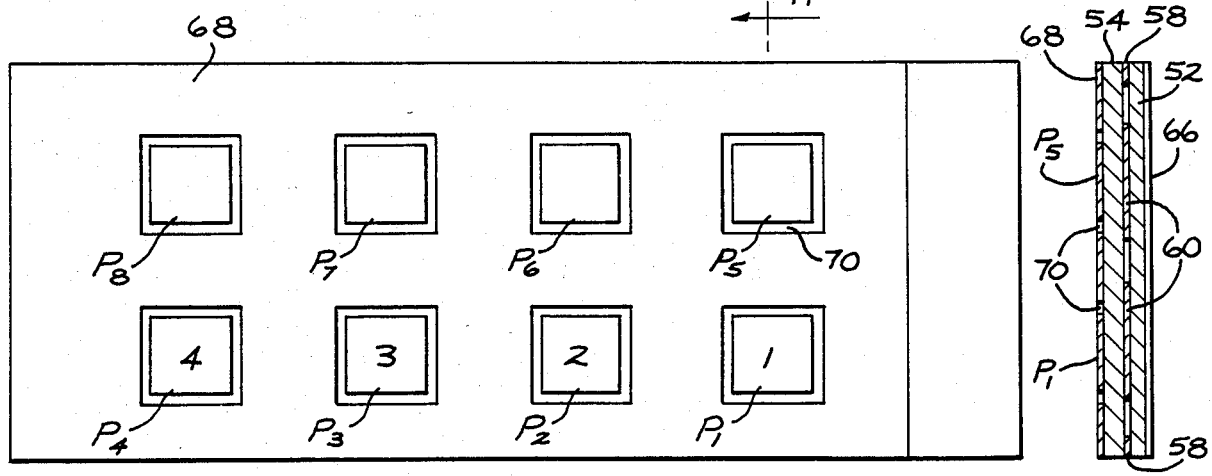
FIG. 10 is a front elevational view of the touch control panel employed in the capacitive touch embodiment of the present invention.
FIG. 11 is a cross-sectional view of the control panel of FIG. 10 taken along lines 11—11.

Referring now to FIGS. 8–11, an illustrative structure for a capacitive touch panel 50 for use in place of touch panel 10 in the circuit arrangement of FIG. 7 comprises a printed circuit board 52 affixed by a low loss adhesive material to a glass plate 54 or other suitable dielectric substrate. As in FIG. 6, the thicknesses in FIGS. 9 and 11 are exaggerated for clarity. The face of the printed circuit board 52 immediately adjacent glass plate 54 has formed thereon by copper etching, conductive inking or other suitable means, conductors configured to form a plurality of interdigitized capacitive elements $C_{R1}'$, $C_{R2}'$ and $C_1'$-$C_8'$. The capacitive elemtns are arranged in two strings. The first string comprising capacitors $C_{R1}'$ and $C_1'$-$C_4'$ is electrically connected in parallel with the string comprising capacitors $C_{R2}'$ and $C_5'$-$C_8'$ by conductors 56 and 58. Within each string the interdigitized capacitive elements are electrically serially connected by conductive sensor pads 60. Conductive plates 62 and 58 formed at opposite ends of the printed circuit board are capacitively coupled to similarly configured plates 64 and 66, respectively, on the opposite face of the circuit board. Conductive plates 64 and 66 provide contact points for connecting the circuit board to the external circuitry. The resulting capacitors permit capacitive coupling of the touch panel to external circuitry. These capacitors are represented schematically as $C_{C1}'$ and $C_{C2}'$ FIG. 7.

Conductive touch pads $P_1$-$P_8$ and the surrounding protective shield 68 are formed by a tin oxide layer on the outer face of the glass plate with the touch pads aligned with the sensor pad 60 of the circuit board. Touch pads $P_1$-$P_8$ cooperate with the corresponding aligned sensor plates 60 on the circuit board to form touch pad capacitors with the glass as a dielectric. These touch pad capacitors are represented schematically as $C_{T1}$-$C_{T8}$ in the circuit of FIG. 7. Conductive shield 68 cooperates with conductive plate 58 formed along three edges of the printed circuit board to form a shield capacitor to capacitively couple the protective shield to ground. The shield capacitor is represented schematically as $C_G$ in the circuit of FIG. 7. The exposed glass area 70 surrounding each of the touch pads $P_1$-$P_8$ effectively isolates the touch pads from the protective shield. The tin oxide layer is formed by depositing tin oxide into the glass, then baking at a high temperature to passivate the tin oxide into the glass. Care must be taken to insure that the tin oxide protective shield 68 does not extend over capacitive plate 62 of the printed circuit board, so that the protective shield doesn't capacitively couple input coupling capacitor $C_{C1}'$ to the output coupling capacitor $C_{22}'$ through the shield.

Indicia identifying the various keys on the touch panel for the user may be applied by standard resist techniques on the inner face of the glass. The user then provides the necessary input data by merely touching the desired key of the touch panel.

It will be apparent from the foregoing that the present invention provides a touch control arrangement requiring only two conductors to couple the touch panel to the microprocessor and which operates to vary the frequency of the control signal applied to the microprocessor in accordance with the user actuated touch pad.

While specific embodiments of the invention have been illustrated and described herein, it is realized that modifications and changes will occur to those skilled in the art. It is therefore to be understood that the appended claims are intended to cover all such modifications as fall within the true spirit and scope of the invention.

What is claimed is:

1. A touch control arrangement for an appliance of the type incorporating a plurality of appliance operating components arranged for selective actuation in accordance with use generated input data, said touch control arrangement comprising:

touch responsive data entry means arranged for user actuation comprising a plurality of touch keys and a capacitive network including a plurality of capacitive elements operatively coupled to said touch keys;

oscillating means for generating a control signal at a plurality of discrete predetermined frequencies; each of said touch keys being uniquely associated with a different one of said plurality of predetermined frequencies, said capacitive network being coupled in tuning relationship with said oscillating means such that the frequency of said control signal is determined by the selective touching of said touch keys by the user; and a microprocessor responsive to said control signal operative to control appliance operation in a manner determined by the frequency of said control signal.

2. A touch control arrangement in accordance with claim 1 wherein said touch keys are constructed and arranged to selectively change the effective capacitance of said capacitive network, thereby tuning said oscillating means to that one of predetermined frequencies associated with the user-actuated key.

3. A touch control arrangement for an appliance comprising:

a plurality of touch keys arranged for user actuation;

oscillating means for generating a control signal tunable to a plurality of discrete predetermined frequencies, different ones of said predetermined frequencies being uniquely associated with different ones of said touch keys;

tuning means comprising a capacitive network including a plurality of capacitive elements, said network being coupled into tuning relationship with said oscillating means, said touch keys being coupled to said capacitive network to change the effective capacitance of said capacitive network such that user-actuation of one of said touch keys tunes said oscillating means to that one of said plurality of frequencies uniquely associated with said one touch key; and a microprocessor responsive to said control signal and arranged to control appliance operation in accordance with the frequency of said control signal.

4. A touch control arrangement in accordance wtih claim 3 wherein said plurality of capacitive elements are serially interconnected and said touch keys are arranged to change the effective capacitance of said capacitive network by selectively shunting portions of said capacitive network.

5. A touch control arrangement in accordance with claim 3 wherein said touch keys and capacitive elements are contstructed and arranged to permit the body capacitance of the user, when touching one of said touch keys, to change the effective capacitance of one element of said capacitive network.

6. A touch control arrangement in accordance with claim 3 wherein said capacitive elements form a plurality of strings of capacitive elements, each string comprising a plurality of capacitive elements connected in electrical series, said strings being connected in electrical parallel, and said touch keys being operative to change said effective capacitance of said capacitive network by selectively shunting portions of said capacitive network.

7. A touch control arrangement in accordance with claim 3 wherein said capacitive network comprises a plurality of strings of capacitive elements, each string comprising a plurality of capacitive elements connected in electrical series, said strings being connected in electrical parallel, and said touch keys being constructed and arranged to permit the body capacitance of the user when touching one of said touch keys, to change the effective capacitance of said capacitive network.

* * * * *